(12) United States Patent
Kuzmenka

(10) Patent No.: US 7,035,160 B2
(45) Date of Patent: Apr. 25, 2006

(54) CIRCUIT

(75) Inventor: Maksim Kuzmenka, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/009,967

(22) Filed: Dec. 10, 2004

(65) Prior Publication Data

US 2005/0146977 A1    Jul. 7, 2005

(30) Foreign Application Priority Data

Dec. 12, 2003    (EP) ................... 03028739

(51) Int. Cl.
     *G11C 7/00*      (2006.01)
(52) U.S. Cl. .................. 365/226; 365/230.06
(58) Field of Classification Search ................ 365/226, 365/230.06
See application file for complete search history.

(56) References Cited

U.S. PATENT DOCUMENTS 6,144,191 A * 11/2000 Raedy ..................... 323/207
6,178,101 B1 * 1/2001 Shires ..................... 363/39
6,329,834 B1   12/2001 Krasnansky
6,366,474 B1 * 4/2002 Gucyski ................... 363/20
2003/0011424 A1   1/2003 Moon et al.
2003/0042991 A1   3/2003 Cotant et al.

FOREIGN PATENT DOCUMENTS

JP      11122911      4/1999

OTHER PUBLICATIONS

Sekhri, S.J., "Power Line Filter," IBM Technical Disclosure Bulletin, vol. 17, No. 7, Dec. 1974.

* cited by examiner

*Primary Examiner*—M. Tran
(74) *Attorney, Agent, or Firm*—Slater & Matsil, L.L.P.

(57) ABSTRACT

A circuit comprises a first supply line and a second supply line. A capacitor is arranged between the first supply line and the second supply line. The first supply line and the second supply line are inductively coupled, such that a switching current on the second supply line induces a compensating current into the first supply line. The compensating current compensates the switching current by flowing from the second supply line over the capacitor into the first supply line.

9 Claims, 4 Drawing Sheets

CIRCUIT

This application claims priority to European Patent Application 03028739.5, which was filed Dec. 12, 2003 and is incorporated herein by reference in its entirety.

TECHNICAL FIELD

The present invention relates to a circuit and, in particular, to an integrated circuit package power supply circuit.

BACKGROUND

A conventional integrated circuit package power supply circuit comprises power supply lines which typically provide an operating voltage VDD and a ground voltage VSS. Normally, the power consumption of an integrated circuit is not constant but changes while the integrated circuit is in operation. One reason for a strong power consumption change is a switching of output signals. Especially, such strong changes in the power consumption result in a voltage noise on the power supply lines. Integrated circuits, like memory chips, which operate at high frequencies and low operating voltages, react very sensitive to voltage swings. Thus, the voltage noise on the power supply lines may cause a failure in the operation of the integrated circuit.

FIG. 1 shows a schematic view of a prior art integrated circuit power supply circuit. The circuit comprises an output stage of an integrated circuit chip 102. The output stage is a "push-pull" output stage, which is typically used for memory chips. The output stage comprises a means for switching 104, a first supply line 106, a second supply line 108, a signal line 110 and a power supply 112 which provides an operating voltage VDD and a ground voltage VSS. The integrated circuit chip 102 and the power supply 112 are typically arranged on a printed circuit board (not shown in FIG. 1). The integrated circuit chip 102 comprises terminals 120, 122, 124 for connecting the integrated circuit chip 102 to the circuit board. The terminals 120, 122, 124 typically are pins or balls.

The first supply line 106 provides the operating voltage VDD from the power supply 112 via the first terminal 120 to the means for switching 104. The second supply line 108 provides the ground voltage VSS from the power supply 112 via the second terminal 122 to the means for switching 104. The signal line 110 is connected to the third terminal 124 and via a pull-up resistor 126 to the first supply line 106. The signal line 110, which is an output line, is connected to a second circuit (not shown).

The means for switching 104 switches the signal voltage on the signal line 110 between the operating voltage VDD and the ground voltage VSS. The means 104 for switching comprises a first transistor 130, a second transistor 132 and a bit source signal 134. The bit source signal 134 is an output of an internal circuit of the integrated circuit chip 102 and controls the signal voltage on the signal-line 110. In a first state, the bit source signal 134 causes the second transistor 132 to close and the first transistor 130 to open and to connect the signal line 110 to the first supply line 106. In this state, the signal voltage on the signal line 110 switches to the operating voltage VDD. In a second state, the bit source signal 134 causes the first transistor 130 to close and the second transistor 132 to open and to connect the signal line 110 to the second supply line 108. Thus, the signal voltage on the signal line 110 switches to the ground voltage VSS.

The inductances 140, 142, 144 are models for the typical inductances of the lines 106, 108, 110. The first supply line 106 and the second supply 108 are decoupled by an in-chip power supply decoupling circuitry, which is modelized by the capacitor 146. In the existing kinds of integrated circuit packages, the inductances 140, 142 of power supply package traces 106, 108 make a large voltage noise due to a high current slew rate across the inductances 140, 142 during the switching of the transistors 130, 132.

FIG. 2 shows a package power supply routing according to the prior art, comprising an integrated circuit chip 201 which is arranged on a circuit package board 202. The integrated circuit chip 201 is connected via a first bond wire 206' to a first supply line 206, via a second bond wire 208' to a second supply line 208 and via a third bond wire 210' to a signal line 210. The supply lines 206, 208 and the signal line 210 correspond to the respective lines shown in FIG. 1. The first supply line 206 is connected to a first terminal 220 of the package board 202, the second supply line 208 connected to a second terminal 222 and the signal line 210 connected to a third terminal 224. Typically the supply lines 206, 208 supply a plurality of output stages or drivers of the integrated circuit chip 201. Therefore, the resulting current on the supply lines 206, 208 is higher than the current on the signal line 210. In order to achieve a high current slew rate on the supply lines 206, 208, the supply lines 206, 208 are typically wider than the signal line 210. This reduces the inductance and resistance of the supply lines 206, 208. An additional reason for this is that in most cases, in an IC package, a pair of supply pins provides a current to more than one, typically to two to four drivers.

Here the integrated circuit chip 201 is a memory chip. The lines 206, 208, 210 are printed circuit board lines on the circuit package board 202 of the memory chip 201 and the terminals 220, 222, 224 are pins or balls, which connect the circuit package board 202 to a memory module (not shown). The signal line 210 is a data quit trace connected to an output driver (not shown in FIG. 2) of the memory chip 201.

FIG. 3 shows a cross-section through a part of the circuit package board 202 and the first supply line 206 shown in FIG. 2. The supply line 206 is formed by a copper trace which is arranged on the circuit package board 202. A surface of the circuit package board 202, opposite to the supply line 206 is covered by a ground plane 202'. In this embodiment a height 300 of the circuit package board 202 is 100 mil or 2.54 mm (1 mil is $\frac{1}{1000}$ of 1 inch), a height 302 of the copper trace 206 is 1 mil or 0.0254 mm, the width 304 of the copper trace 206 is 2 mil and the length 306 of the copper trace 206 is 200 mil or 5.08 mm. The dielectric constant Er is 4.5.

FIG. 4 shows a simulation result of the circuit shown in FIG. 1. The simulation tool "Advanced Design Studio", simulator version 2000C was used for simulation. A model for the supply lines 106, 108 is shown in FIG. 3. The driver output resistance of the means for switching 104 is assumed as Ron=20 Ohm, the output signal rise/fall time from 10% to 90% as Trf=325 ps for the signal line 110, the bit-rate of the signal line 110 is 1.6 Gbps, the termination resistance of the termination resistor 126 is R1=30 Ohm, the power supply voltage VDD is 1.8V and the internal power decoupling capacitor has a capacity of C1=500 pF.

The characteristics 440, 442, 444 shown in FIG. 4 represent the voltage levels on the lines 106, 108, 110 over the time. The characteristic 440 corresponds to the voltage level on the first supply line 106, the characteristic 442 corresponds to the voltage level on the second supply line 108 and the characteristic 444 corresponds to the voltage level of the signal line 110. In the beginning, the voltages on the signal line 110 and the first supply line-106 are stable at 1.8V. The voltage on the second supply line 108 is stable at 0V. After 1ns the bit source signal 134 switches and causes the first transistor 130 to close and the second transistor 132 to open. Consequently, the voltage on the signal line 110 switches to a low level. Due to the output resistance of the second transistor 132, the characteristic 444 does not drop down to 0V but settles at approximately 0.7V. After 2 ns the bit source signal 134 again switches and causes the first transistor 130 to open and the second transistor 132 to close. Consequently the characteristic 444 of the signal line-110 rises again. As can be seen from FIG. 4, the characteristics 440, 442 of the supply lines 106, 108 are not stable at 1.8V and 0V but are affected by the switching voltage of the signal line 110, represented by the characteristic 444. The simulation results show an unacceptable high ground and VDD bounce on the characteristics 440, 442. This voltage swing has an upper peak value 450 of 0.256 V above the VDD voltage of 1.8V and a lower peak value 452 of 0.272V below the normal ground voltage of 0V. A maximum difference of the voltage level of the characteristics 440, 442 is 0.067V. Thus, the voltage swing is approximately 15% of the supply voltage value. Thus, even though the supply lines 206, 208 are formed as wide copper traces, as shown in FIG. 2, the voltage noise on the supply lines 206, 208 is too high for a secure operation of an integrated circuit like a memory chip.

To reduce the voltage noise on the power supply lines, additional power supply lines are necessary or the existing power supply lines have to be designed still wider. Because of space limitations on the circuit package board 202, such solutions are often not realizable.

SUMMARY OF THE INVENTION

It is the object of the present invention to provide a reliable circuit which offers an extended design flexibility at lower costs.

In accordance with a first aspect, the present invention provides a circuit having a first supply line for supplying a first voltage; a second supply line for supplying a second voltage; a capacitor arranged between the first and the second supply line; wherein the first and the second supply lines have a magnetic coupling between each other, such that a switching current on the second supply line induces a compensating current into the first supply line, and wherein the compensating current compensates the switching current by flowing from the second supply line over the capacitor into the first supply line.

The present invention is based on the finding that an inductance of a supply line and a correct phase of an inductive coupling can be advantageously used to induce a compensating current into a second supply line which serves as a compensation line. The compensating current in the compensation line is used for compensating a current in the first supply line which would otherwise cause a voltage swing in the first supply line.

Therefore, the present invention proposes a new kind of a package power supply routing which uses magnetic coupled supply traces for reducing noise on the supply lines.

Besides reducing power and ground noise on the supply lines, the present invention allows to route the supply lines close together. Contrary to prior art designs in which crosstalk between neighboring lines is a problem which is avoided by keeping a distance between neighboring lines, the present invention advantageously uses crosstalk between neighboring lines. Thus, the present invention reduces the space required for the supply lines by allowing to route neighboring lines close together. A further space reduction is achieved by reducing the width of the supply line traces to the width of normal signal lines. Further, the inventive approach allows to design a one layer package printed circuit board having the same supply inductance like a prior art multilayer printed circuit board. These advantages result in a cost reduction and a higher design flexibility.

A preferred embodiment of the present invention is described hereinafter making reference to the appended drawings.

BRIEF DESCRIPTION OF THE DRAWINGS

These and other objects and features of the present invention will become clear from the following description taken in conjunction with the accompanying drawing, in which.

Figure 1:
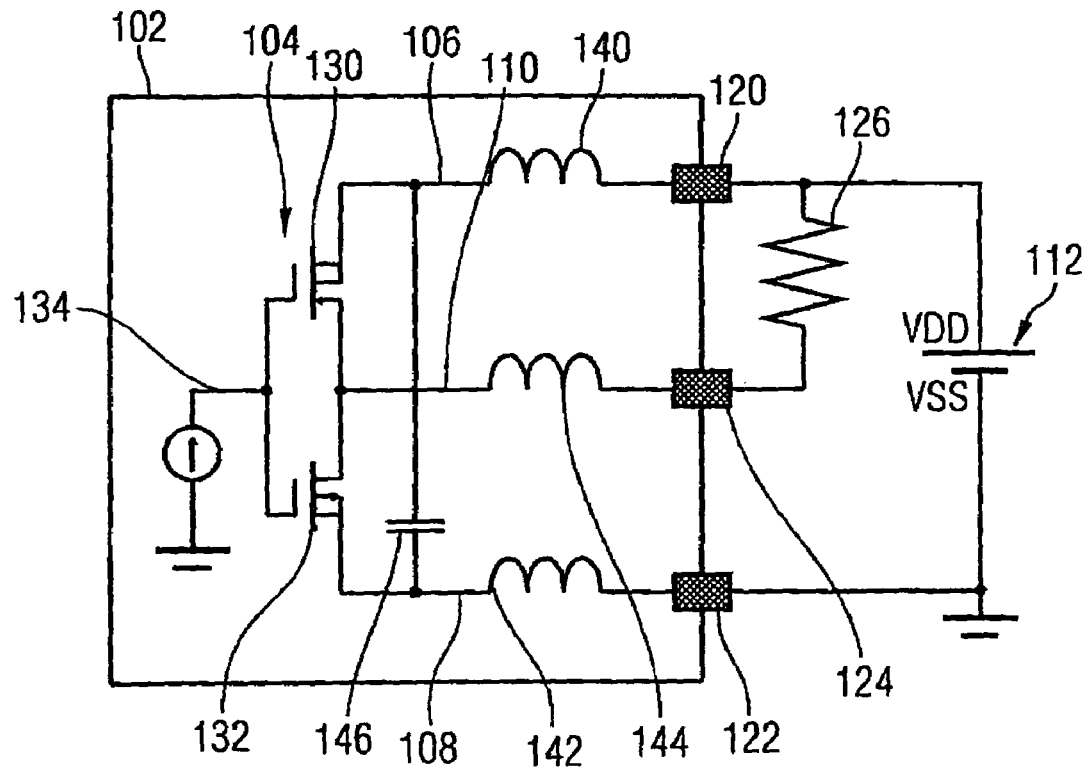
FIG. 1 shows a schematic view of a circuit according to the prior art.

The following list of reference symbols can be used in conjunction with the figures:

102 integrated circuit
104 means for switching
106 first supply line
108 second supply line
110 signal line
112 power supply
120 first terminal
122 second terminal
124 third terminal
126 resistor
130 first transistor
132 second transistor
134 bit source signal
140 first inductance
142 second inductance
144 third inductance
146 capacitor
201 integrated circuit chip
202 circuit package board
206' first bond wire
208' second bond wire
210' first bond wire
206 first supply line
208 second supply line
210 signal line
220 first terminal
222 second terminal
224 third terminal
202' ground plane
300 height of the package board
302 height of the supply line
304 width of the supply line
306 length of the supply line 440 characteristic of the first supply line
442 characteristic of the second supply line
444 characteristic of the third supply line
450 peak value of the characteristic 440
452 peak value of the characteristic 442
502 integrated circuit
506 first supply line
508 second supply line
540 first inductances
542 second inductance
560 coupling region
570, 572 switching current
574, 576, 578 compensating current
601 integrated circuit chip
602 circuit package board
606' first bond wire
608' second bond wire
610' third bond wire
606 first supply line
608 second supply line
610 signal line
620 first terminal
622 second terminal
624 third terminal
660 coupling region
602' ground layer
708 distance between supply lines
840 characteristic of the first supply line
842 characteristic of the second supply line
844 characteristic of the signal line

DETAILED DESCRIPTION OF ILLUSTRATIVE EMBODIMENTS

Figure 5:
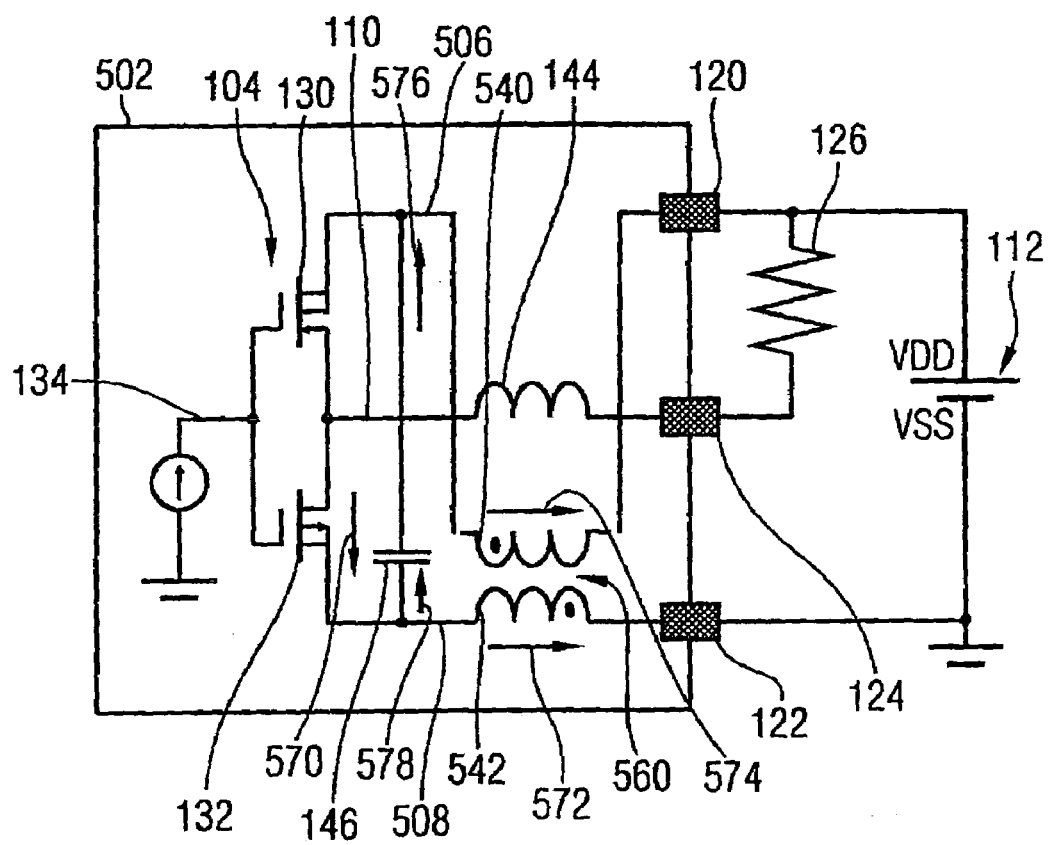
FIG. 5 shows a schematic view of a circuit according to the present invention.

FIG. 5 shows a schematic view of an integrated circuit package power supply circuit according to the present invention. Elements which are identical to elements shown in FIG. 1 are marked with the same reference numbers and are not described again. As can be see in FIG. 5, the difference between an integrated circuit chip 502 according to the present invention and according to the prior art is a different routing of the first supply line 506 and the second supply line 508. According to the present invention, the routing is such that an inductance 540 of the first supply line 506 is adjacent to an inductance 542 of the second supply line 508. Thus, within a coupling region 560 an inductive coupling takes place between the first supply line 506 and the second supply line 508. The supply lines 506, 508 are routed such that supply currents in the supply lines 506, 508 have opposite directions.

Typically, the integrated circuit chip 502 is a silicon chip. The capacitor 146 is normally integrated into the silicon chip. Alternatively, the capacitor 146 is a discrete capacitor, arranged on the integrated circuit chip 502.

In the following a switching event which switches the signal voltage of the signal line 110 from a high voltage to a low voltage is described. Before the switching event, the first transistor 130 is open and the second transistor 132 is closed. Thus, the signal line 110 is settled at a high voltage level and the second supply line 508 is settled at a ground voltage level. The switching event closes the first transistor 130 and opens the second transistor 132. The opening of the second transistor 132, causes a switching current 570 to flow through the second transistor 132, through the inductance 542, shown as current 572 to the power supply 112. Due to the high current slew rate of the switching current 570, 572 a voltage glitch appears. The switching current 572 provokes a magnetic field in the inductance 542 which induces a compensating current 574 in the inductance 540 of the first supply line 506. Thus, the first supply line 506 serves as a compensating line. As the first transistor 130 is closed, the compensating current 574 flows as current 576 and current 578 over the capacitor 146 from the second supply line 508 to the first supply line 506. The first and the second supply lines 506, 508 are routed such that the compensating current 574 has the same direction as the switching current 572. An ideal conductive coupling of the supply lines 506, 508 would reflect a compensating current 574 into the first supply line 506 which is identical to the switching current 572 in the second supply line 508. Thus, the compensating current 578 compensates the switching current 570 at the node, the capacitance 146 is connected to the second supply line 508. This results in a reduced current slew rate and a voltage drop across the inductance 542.

In the following a switching event is described in which the signal voltage of the signal line 110 is switched from the low voltage level to the high voltage level by opening the first transistor 130 and closing the second transistor 132. Due to the opening of the first transistor 130, a switching current flows from the power supply 112 over the first supply line 506 and the inductance 540 over the first transistor 130 to the signal line 110. Due to the switching current in the inductance 540, a compensating current similar to the switching current is induced into the inductance 542 of the second supply line 508. Again the compensation current reduces the switching current on the first supply line 506 by flowing through the capacitance 146 from the second supply line 508 to the first supply line 506.

Figure 2:
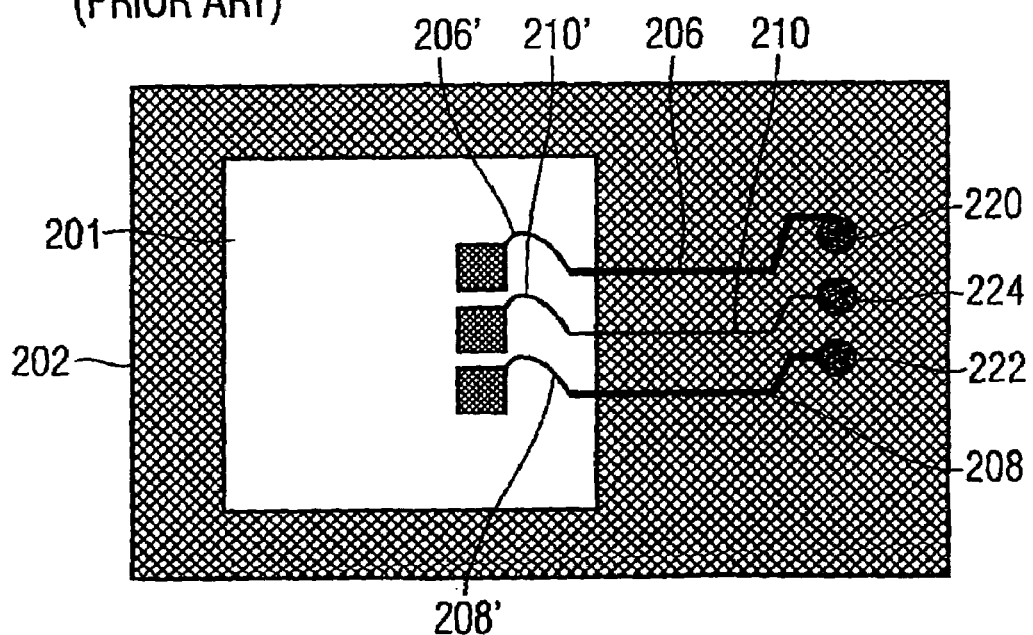
FIG. 2 shows a package board wiring according to the prior art.
Figure 6:
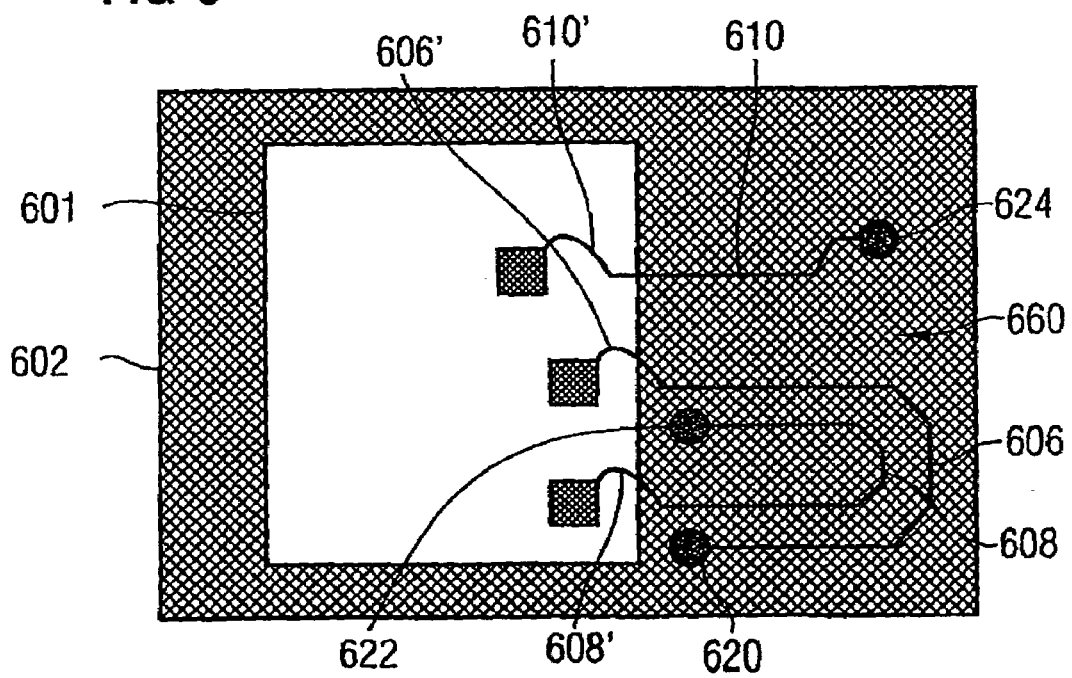
FIG. 6 shows a package board wiring according to the present invention.

FIG. 6 shows an integrated circuit chip 601, like a memory chip which is arranged on a circuit package board 602. According to the arrangement shown in FIG. 2, an integrated circuit chip 601 is connected via bond taps and wires 606', 608', 610' to a first supply line 606, a second supply line 608 and a signal line 610. The supply lines 606, 608 correspond to the supply lines 506, 508 shown in FIG. 5 and connect the circuit chip 601 via terminals 620, 622 to a power supply (not shown). The signal line 610 corresponds to the signal line 110 shown in FIG. 5 and represents a data quit trace connected to a terminal 624 of the circuit package board 602. As can be seen from FIG. 6, the supply lines 606, 608 are routed close together and in parallel within a coupling region 660. Thus, an inductive coupling between the two lines can take place. Moreover, the supply lines 606, 608 are routed in opposite directions. Due to the inventive arrangement the traces of the supply lines 606, 608 can be form ed as narrow as the trace of the signal line 610.

Typically, the supply lines (606, 608) are printed circuit board traces. Alternatively, the supply lines (606, 608) are wires of a TSSOP like package.

Figure 3:
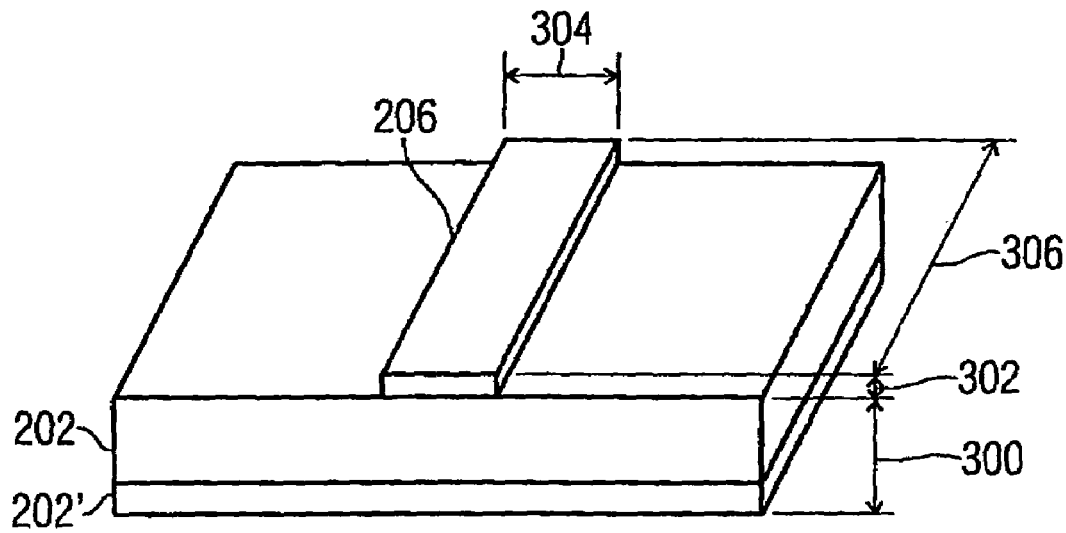
FIG. 3 shows a cross-section view of a supply line according to the prior art.
Figure 7:
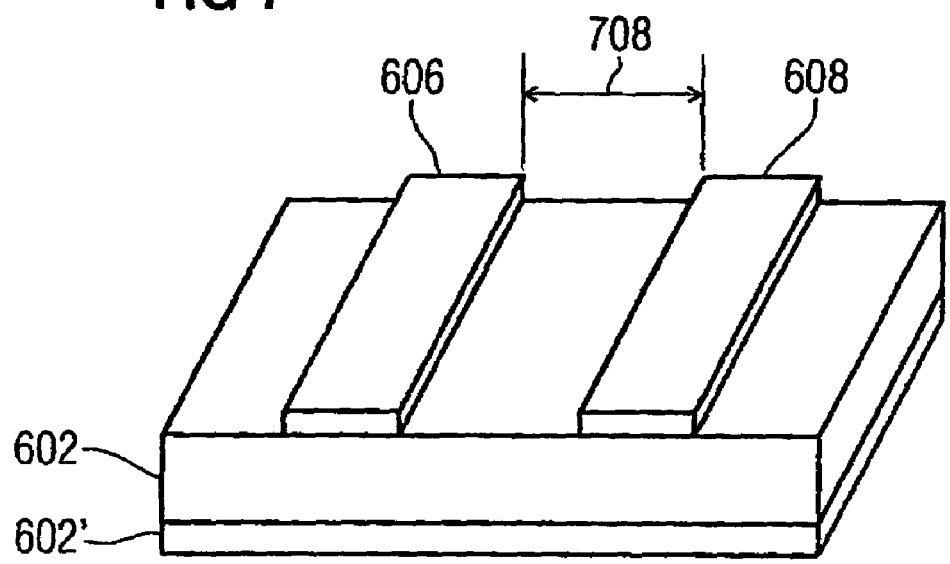
FIG. 7 shows a cross-section view of the supply lines according to the present invention.

FIG. 7 shows a cross-section view of a part of the package board 602 and the supply lines 606, 608. Again the package board 602 is covered by a ground layer 602' at a surface opposite to the supply lines 606, 608. A distance 708 between the traces of the supply lines 606, 608 is about 1 mil or 0.0254 mm. The other dimensions are identical to the dimensions shown in FIG. 3.

Figure 4:
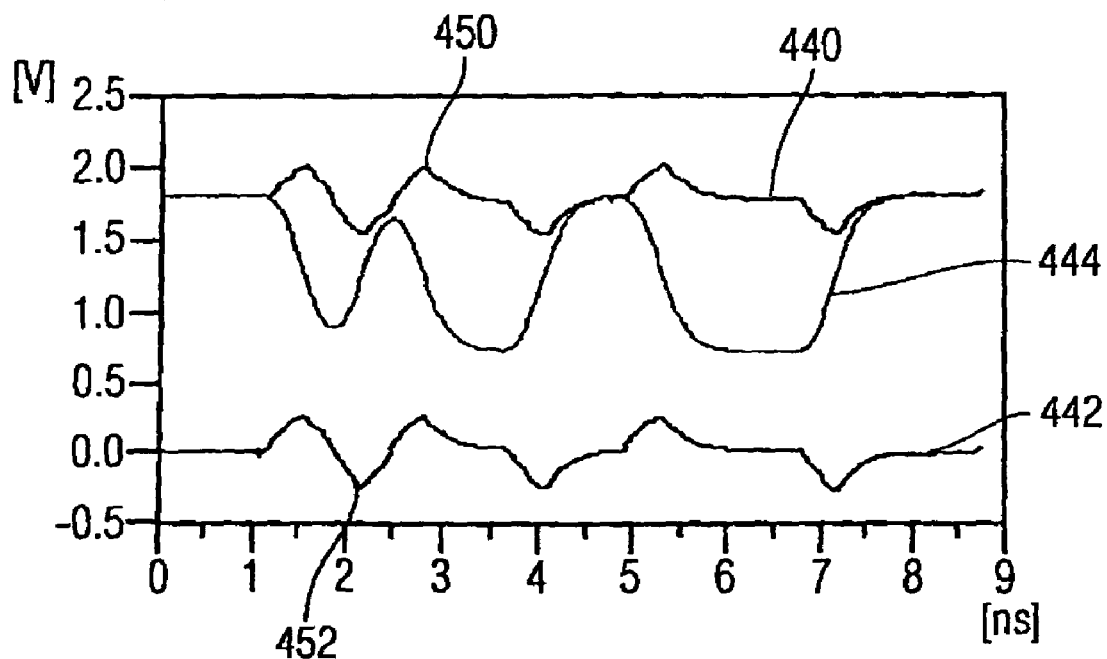
FIG. 4 shows a simulation result of the circuit according to the prior art.
Figure 8:
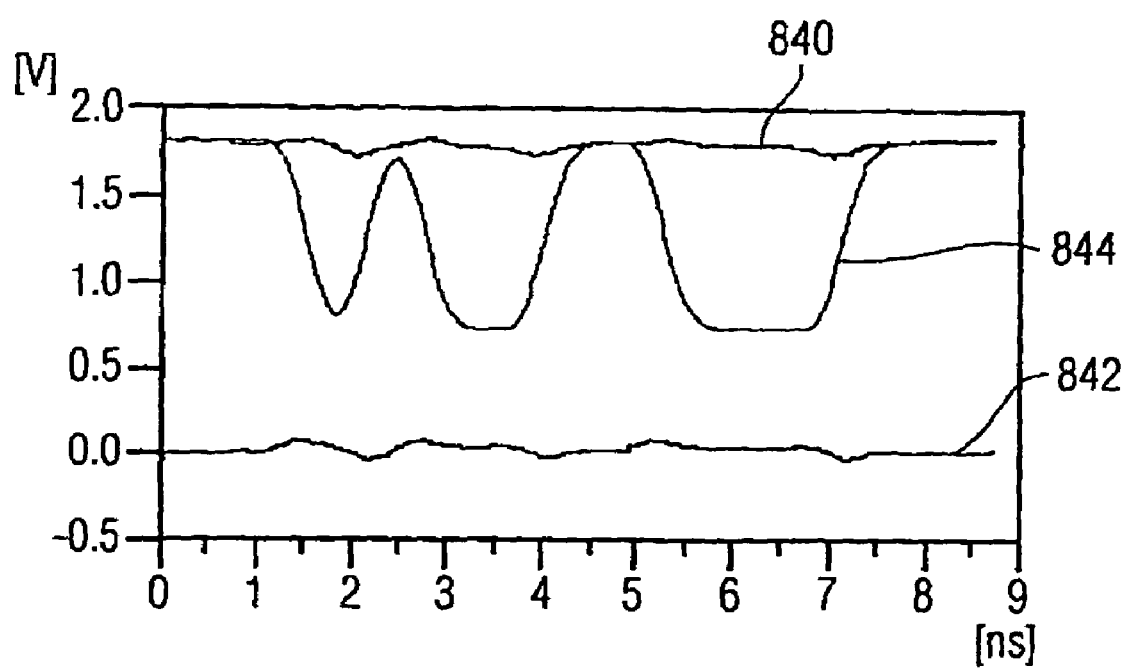
FIG. 8 shows a simulation result of the circuit according to the present invention.

FIG. 8 shows a simulation result of the circuit shown in FIG. 5. The simulation is based on a model of the supply lines 606, 608 as described in FIG. 7 and the tools and assumptions as described in FIG. 4. FIG. 8 shows a characteristic 840, which corresponds to a voltage level of the first supply line 606, a characteristic 842, which corresponds to a voltage level of the second supply line 608 and a characteristic 844, which corresponds to a voltage level of the signal line 110 over the time. As can be seen from the characteristics 840, 842, 844 there is almost no voltage noise on the supply lines 606, 608 due to switching events on the signal line 110. A maximum voltage swing on the first supply line is 0.077V above the supply voltage of 1.8V and 0.073V below the ground voltage of 0V. A maximum difference of the voltage levels of the characteristic 840, 842 is 0.084V. The inventive approach reduces the ground and VDD noise to 4.3% of the supply voltage of 1.8V. Compared to the prior art, the level of noise is improved by a factor more than three.

Although, the present invention has been described above, making reference to supply lines for an output stage of an integrated circuit, it is clear that the present invention can also be used in connection with any other lines which suffer from noise due to a switching event. The compensation line does not have to be another power supply line but can be any line, a compensating current can be induced for compensating a switching current.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A circuit comprising:
   a first supply line for supplying a first voltage;
   a second supply line for supplying a second voltage;
   a switch for switching a signal voltage on a signal line between the first voltage and the second voltage; and
   a capacitor arranged between the first supply line and the second supply line;
   wherein the first supply line and the second supply line are inductively coupled, such that a switching current on the second supply line induces a compensating current into the first supply line; and
   wherein the compensating current compensates the switching current by flowing from the second supply line over the capacitor into the first supply line.

2. The circuit according to claim 1, wherein the switch for switching is an output stage of a circuit chip.

3. The circuit according to claim 1, wherein the switch for switching comprises a first transistor and a second transistor, wherein the first transistor connects the first supply line and the signal line, and wherein the second transistor connects the signal line and the second supply line.

4. The circuit according to claim 2, wherein the capacitor is an in-chip power supply decoupling circuitry of the circuit chip.

5. The circuit according to claim 1, wherein the signal line is connected to the first supply line via a resistor.

6. The circuit according to claim 1, wherein the first supply line and the second supply line are connected to a provider for providing the first voltage and the second voltage to the first supply line and the second supply line.

7. The circuit according to claim 1, further comprising a coupling region in which the first supply line and the second supply line are routed in parallel such that the switching current on the second supply line induces the compensating current into the first supply line.

8. The circuit according to claim 1 wherein the first supply line and the second supply line are printed circuit board traces or wires of a TSSOP like package.

9. The circuit according to claim 2, wherein the circuit chip is a mommy chip which is arranged on a circuit package board and wherein the first supply line and the second supply line connect the memory chip to terminals of the circuit package board.

* * * * *

UNITED STATES PATENT AND TRADEMARK OFFICE
CERTIFICATE OF CORRECTION

| | |
|---|---|
| PATENT NO. | : 7,035,160 B2 |
| APPLICATION NO. | : 11/009967 |
| DATED | : April 25, 2006 |
| INVENTOR(S) | : Kuzmenka |

Page 1 of 1

It is certified that error appears in the above-identified patent and that said Letters Patent is hereby corrected as shown below:

Column 8, line 33: delete "mommy" and insert --memory--.

Signed and Sealed this

Eleventh Day of July, 2006

JON W. DUDAS
*Director of the United States Patent and Trademark Office*